(12) United States Patent
Tsuzuki et al.

(10) Patent No.: US 8,420,465 B2
(45) Date of Patent: Apr. 16, 2013

(54) ORGANIC THIN FILM TRANSISTOR MANUFACTURING METHOD AND ORGANIC THIN FILM TRANSISTOR

(75) Inventors: Seiichi Tsuzuki, Takatsuki (JP); Jun Yamada, Ibaraki (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/129,250

(22) PCT Filed: Oct. 9, 2009

(86) PCT No.: PCT/JP2009/067627
§ 371 (c)(1),
(2), (4) Date: May 13, 2011

(87) PCT Pub. No.: WO2010/058662
PCT Pub. Date: May 27, 2010

(65) Prior Publication Data
US 2011/0254003 A1      Oct. 20, 2011

(30) Foreign Application Priority Data
Nov. 19, 2008   (JP) .................................. 2008-295427

(51) Int. Cl.
*H01L 21/00*      (2006.01)
*H01L 21/84*      (2006.01)

(52) U.S. Cl.
USPC ............. 438/158; 438/99; 438/149; 438/151; 257/E21.411; 257/E29.273

(58) Field of Classification Search ............ 438/48, 438/99, 139, 149, 158, 780; 257/40, 57, 257/59, 99, E21.114, E21.411, E29.273
See application file for complete search history.

(56) References Cited

U.S. PATENT DOCUMENTS

2006/0092191 A1 *   5/2006   Sakai et al. ........................ 347/1
2006/0281332 A1    12/2006   Duinveld et al. .............. 438/780
(Continued)

FOREIGN PATENT DOCUMENTS

CN    1791965 A    6/2006
CN    1905233 A    1/2007
(Continued)

OTHER PUBLICATIONS

Written Opinion of the International Searching Authority issued on Nov. 2, 2009, concerning International Application No. PCT/JP2009/067627 filed on Oct. 9, 2009, together with an English language translation of the Relevant Part thereof.

*Primary Examiner* — Charles Garber
*Assistant Examiner* — Abdulfattah Mustapha
(74) *Attorney, Agent, or Firm* — Cozen O'Connor

(57) ABSTRACT

Provided are an organic TFT manufacturing method whereby flow of ink into an unnecessary area can be suppressed and excellent characteristics and high reliability can be obtained, and an organic TFT. The organic TFT manufacturing method comprises a step of providing a source electrode and a drain electrode on a base member; a step of providing a bank layer, which has an opening on a channel between the source electrode and the drain electrode, an opening on a predetermined area of the base member, and a groove or grooves around the opening on the predetermined area, which surround the opening on the predetermined area; and a step of supplying an organic semiconductor solution to the opening of the bank layer formed on the channel to form an organic semiconductor layer.

26 Claims, 2 Drawing Sheets

U.S. PATENT DOCUMENTS

| | | | |
|---|---|---|---|
| 2007/0023837 A1 | 2/2007 | Lee et al. | 257/347 |
| 2007/0120111 A1* | 5/2007 | Nakamura et al. | 257/40 |
| 2007/0267630 A1* | 11/2007 | Izumi et al. | 257/40 |
| 2009/0180044 A1* | 7/2009 | Kim et al. | 349/43 |

FOREIGN PATENT DOCUMENTS

| | | |
|---|---|---|
| DE | 602004006256 T2 | 1/2008 |
| JP | 2000-353594 A | 12/2000 |
| JP | 2005-142474 A | 6/2005 |
| JP | 3692524 B2 | 7/2005 |
| JP | 2007-036259 A | 2/2007 |
| JP | 2007-142435 A | 6/2007 |
| JP | 2007-515776 A | 6/2007 |
| KR | 10-2006-0015270 A | 2/2006 |
| KR | 10-2007-0013888 A | 1/2007 |
| WO | WO 2004/105104 A1 | 12/2004 |
| WO | WO 2010/058662 A1 | 5/2010 |

* cited by examiner under 35 U.S.C. 371 of International Application No. PCT/JP2009/067627, filed with the Japanese Patent Office on Oct. 9, 2009, which claims priority to Japanese Patent Application No. 2008-295427, filed Nov. 19, 2008.

ORGANIC THIN FILM TRANSISTOR MANUFACTURING METHOD AND ORGANIC THIN FILM TRANSISTOR

RELATED APPLICATIONS

This application is a U.S. National Stage Application under 35 U.S.C. 371 of International Application No. PCT/JP2009/067627, filed with the Japanese Patent Office on Oct. 9, 2009, which claims priority to Japanese Patent Application No. 2008-295427, filed Nov. 19, 2008.

TECHNICAL FIELD

The present invention relates to an organic thin film transistor manufacturing method, and to an organic thin film transistor.

TECHNICAL BACKGROUND

In recent years, technique for forming a thin film transistor (hereinafter also referred to as TFT) on a basal plate has greatly progressed. Particularly, its application to a driving element of an active matrix type large screen display has been developed. A TFT, which has currently been put to practical use, is manufactured employing a Si based inorganic material such as a-Si or poly-Si. However, the manufacture of a TFT employing such an inorganic material requires a vacuum process or high temperature process, which has a great influence on the manufacture cost.

In order to solve the problem as described above, a TFT employing an organic material (hereinafter also referred to as organic TFT) has been intensively investigated in recent years. Organic materials have a wide choice of materials as compared to inorganic materials. Further, in the manufacturing process of an organic TFT, a process such as printing or coating, which is excellent in productivity, is used instead of the vacuum process or the high temperature process as described above, whereby the manufacturing cost can be suppressed. Further, an organic TFT can be formed on a less heat resistant basal plate such as a plastic film basal plate and its application to many fields has been investigated.

As a coating method of an organic semiconductor material, there is known a liquid droplet coating technique such as an ink jet process or a dispenser method, in which direct coating of a solution containing an organic semiconductor material (hereinafter also referred to as ink) is carried out. There are advantages in these techniques that (1) a vacuum process is not required, (2) waste of materials is reduced, and (3) since direct patterning is possible, an etching process as carried out in photolithography is unnecessary. These techniques can suppress the manufacturing cost, and have been intensively investigated in various fields.

In order to obtain excellent electric properties and high reliability in such an organic TFT, it is necessary that an organic semiconductor layer be formed in an appropriate thickness and precisely at a pre-determined position. However, when an organic semiconductor layer of an organic TFT is formed using the ink jet process or the dispenser method as described above, in some cases a jetted ink wet-spreads on a basal plate due to the influence of surface conditions of the basal plate, ambient atmosphere or the like, and reaches an unnecessary area before the ink is dried to solidify. In such a case, there occurs problem that pattern defect is produced, a sufficient thickness is not obtained, and as a result, an organic TFT with good characteristics cannot be obtained.

In order to solve the problem above, various techniques have been investigated. For example, a technique is known in which a partition wall called a bank is formed around an area to be coated so that the wall prevents jetted ink from flowing outside the area to be coated (Patent Document 1).

However, the effect of preventing jetted ink from flowing outside the area to be coated is not sufficient in the bank disclosed in Patent Document 1. The reason is as follows.

1. Ink Solvent

An organic semiconductor material is ordinarily low in solubility, and even a precursor material, in which solubility is increased, is soluble only in an organic solvent. The organic solvent is poor in the intermolecular interaction and generally low in the surface tension, as compared to water (73 mN/m). The surface tension of an organic solvent is as follows, for example, methanol: 23 mN/m; ethanol: 23 mN/m; isopropyl alcohol: 21 mN/m; acetone: 23 mN/m; benzene: 29 mN/m; n-hexane: 18 mN/m; n-pentane: 16 mN/m; monomethyl ether acetate (PGMEA): 24 mN/m; and anisole: 33 mN/m Accordingly, ink of an organic semiconductive material employing an organic solvent is likely to wet the bank, and is difficult to control its flow.

2. Ink Concentration

Solubility of an organic semiconductive material is ordinarily less than 1%, and at most around several percent. Therefore, in order to secure a required thickness of an organic semiconductor layer it is necessary to coat a large amount of ink. Consequently, it is not easy to prevent the ink flow via a bank.

3. Ink Coating Region

A channel, where an organic semiconductor layer is to be formed, has at most a size of 30 µm (short side)×100 µm (long side), and ordinarily a size of 10 µm (short side)×30 µm (long side). On the other hand, the size of ink droplets jetted by means of an ink jet process is 10 to 20 µm Φ. Therefore, when deposition accuracy of the ink droplets or pattern forming accuracy of the channel is taken into account, the ink droplets, after deposition to the channel, spread on the bank. That is, it is difficult to prevent the undesired ink flow by means of a bank.

In order to solve the above problem, a method is known in which the shape of the bank is improved and an opening is formed both on the channel and on an ink guide region extending outward from the channel, whereby the ink is introduced into the channel through the ink guide region (Patent Document 2).

PRIOR ART LITERATURES

Patent Documents

Patent Document 1: Japanese Patent No. 3692524
Patent Document 2: Japanese Laid Open Patent Publication No. 2007-142435

DISCLOSURE OF THE INVENTION

Problems to be Solved by the Invention

However, the method disclosed in Patent Document 2 has problem in that although it can introduce the ink into the channel, it cannot prevent flow of the ink into an area, which the ink is not to flow into.

For example, in a display equipped with an organic TFT, there are some cases in which multiplication of a TFT, multiple layer formation of each of a TFT and a pixel electrode, and the like are necessary, and a contact hole, through which a predetermined electrode disposed in the upper layer of the multilayer is connected to that in the lower layer of the multilayer is formed. When the ink flows into and deposits on such a contact hole, there is problem in that connection fault occurs, and a good display image cannot be obtained. Thus, a technique has been required in which the flow of ink into an area into which the ink is not to flow is suppressed.

In view of the above, the present invention has been made, and an object of the invention is to provide a method of manufacturing an organic TFT whereby flow of ink into an unnecessary area can be suppressed and excellent characteristics and high reliability can be obtained, and to provide an organic TFT.

Means for Solving the Above Problems

The above object of the invention can be attained by any one of the inventions described in the following items 1 through 11.

1. A method of manufacturing an organic thin film transistor, featured in that it comprises a step of providing a source electrode and a drain electrode on a base member; a step of providing a bank layer, which has an opening on a channel between the source electrode and the drain electrode, an opening on a predetermined area of the base member, and a groove or grooves around the opening on the predetermined area, which surround the opening on the predetermined area; and a step of supplying an organic semiconductor solution to the opening of the bank layer formed on the channel to form an organic semiconductor layer.

2. A method of manufacturing an organic thin film transistor of item 1 above, featured in that the supplying of the organic semiconductor solution is carried out employing an ink jet process.

3. A method of manufacturing an organic thin film transistor of item 1 or 2 above, featured in that a material for the bank layer is repellent against the organic semiconductor solution.

4. A method of manufacturing an organic thin film transistor of any one of items 1 through 3 above, featured in that a plurality of the grooves are formed.

5. A method of manufacturing an organic thin film transistor of any one of items 1 through 4 above, featured in that the predetermined area is an area, extending from the source electrode or the drain electrode, in which a connecting terminal is provided.

6. A method of manufacturing an organic thin film transistor of item 5 above, featured in that it further comprises a step of forming a pixel electrode to be connected with the connecting terminal through the opening of the bank layer formed on the predetermined area.

7. A method of manufacturing an organic thin film transistor of any one of items 1 through 6 above, featured in that it further comprises a step of forming a passivation layer on the organic semiconductor layer.

8. A method of manufacturing an organic thin film transistor of any one of items 1 through 7 above, the organic thin film transistor being of a bottom gate type structure, featured in that the base member comprises a basal plate, a gate electrode formed on the basal plate and a gate insulation layer covering the gate electrode.

9. A method of manufacturing an organic thin film transistor of item 8 above, featured in that it comprises providing a wiring pattern under the gate insulation layer to form the groove or grooves, wherein the thickness of the wiring pattern partially raises the surface of the gate insulation layer, thereby partially raising the surface of the bank layer formed on the gate insulation layer.

10. A method of manufacturing an organic thin film transistor of any one of items 1 through 6 above, the organic thin film transistor being of a top gate type structure, featured in that the base member is a basal plate.

11. An organic thin film transistor manufactured employing the organic thin film transistor manufacturing method of any one of items 1 through 10 above.

Effects of the Invention

In the invention, even when the ink supplied into the channel flows beyond the bank, the flow of the ink into a predetermined area into which the ink is not to flow is prevented by the groove provided around the predetermined area. As a result, an organic TFT with excellent characteristics and high reliability can be manufactured.

PREFERRED EMBODIMENT OF THE INVENTION

Figure 1A:
FIGS. 1a, 1b, 1c, 1d-1, 1d-2, 1e, 1f, and 1g show sectional schematic views and a plan schematic view, demonstrating a manufacturing method of a bottom gate type organic TFT in the embodiment of the invention.

Next, the preferred embodiment of the organic TFT manufacturing method and the organic TFT of the present invention will be explained with reference to drawings. The invention will be explained based on the embodiment illustrated in the drawings, but is not specifically limited to the embodiment.

A bottom gate type organic TFT manufacturing method of the invention, which is one of the embodiments of the invention, will be explained with reference to FIG. 1. FIGS. 1a through 1g are sectional views showing an outline of a manufacturing method of a bottom gate type organic TFT 1.

Firstly, a gate electrode G is formed on a basal plate P (FIG. 1a). As a material for the basal plate P, there can be used polyimide, polyamide, polyethylene terephthalate (PET), polyethylene naphthalate (PEN), polyester sulfone (PES), glass, and the like.

The gate electrode G can be formed on a basal plate P by forming a film of a gate electrode material on the basal plate P employing a sputtering method or a vapor deposition method and then subjecting the film to patterning employing a photolithographic method. As a material for the gate electrode G, there can be used Al, Au, Ag, Pt, Pd, Cu, Cr, Mo, In, Zn, Mg, and their alloys or oxides, and organic conductive materials such as carbon nanotubes.

Figure 1B:
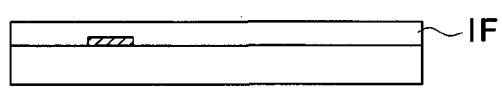

Subsequently, a gate insulation layer IF is formed (FIG. 1b). The gate insulation layer IF can be formed according to a sputtering method, a vapor deposition method or a CVD method. As a material for the gate insulation layer IF, there can be used inorganic oxides such as silicon oxide, aluminum oxide, tantalum oxide and titanium oxide; inorganic nitrides such as silicon nitride and aluminum nitride; and organic compounds such as polyimide, polyamide, polyester, polyacrylate, a photoradical or photocationic polymerization type photocurable resin, a copolymer containing an acrylonitrile component, polyvinyl phenol, polyvinyl alcohol, novolak resin and cyanoethyl pullulan.

Figure 1C:
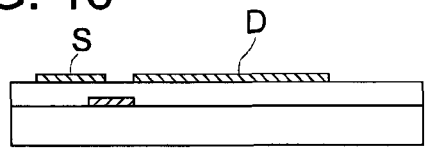

Subsequently, a source electrode S and a drain electrode D are formed (FIG. 1c). After the basal plate P on which the gate insulation layer IF was formed is washed, the source and drain electrodes can be formed according to the photolithographic method as described above in the formation of the gate electrode (various printing methods or a liquid droplet coating method. As a material for the source electrode S and the drain electrode D, there can be used the same materials as those described above as the materials for the gate electrode G.

Figures 1, 1D:
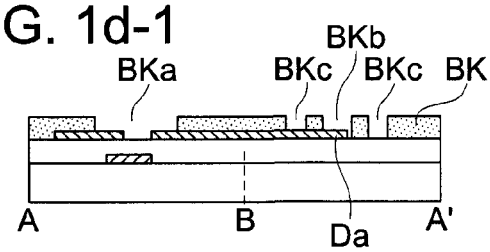
Figures 1, 1D, 2:
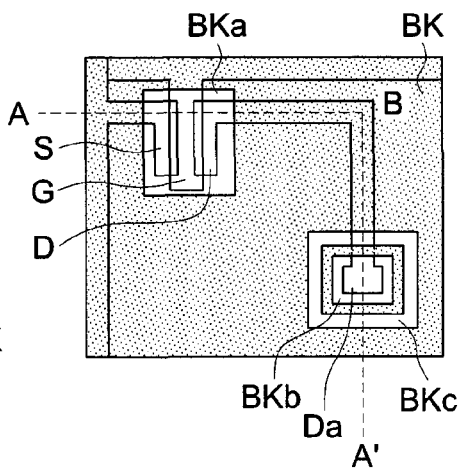

Subsequently, a bank layer BK is formed (FIGS. 1d-1 and 1d-2). Herein, FIG. 1d-2 is a plan schematic view of FIG. 1d-1, and FIG. 1d-1 shows a sectional view in dotted line A-B-A' in FIG. 1d-2. The bank layer BK can be formed by forming a film of a bank material employing a spin coating method and then subjecting the film to patterning employing a photolithographic method. As a material for the bank layer BK, there can be used a bank material having liquid repellency against an organic semiconductor solution (ink) IK. Preferred examples of the bank material include acryl resins, polyimide resins and epoxy resins, which are insoluble in a solvent of ink IK. Particularly when a resin with light sensitivity is used as the bank material, fine patterning can be carried out via photolithography. On the other hand, when a resin having no light sensitivity is used as the bank material, patterning can be carried out using printing technology. Even a resin having no liquid repellency can be used, as long as the resin contains a liquid repellent component, which oozes on the resin surface to exhibit liquid repellency.

Herein, the shape of the bank layer BK will be explained. In the bank layer BK, an opening BKa is formed on a channel between the source electrode S and the drain electrode D and an opening BKb is formed on an area which extends from the drain electrode D and corresponds to a connecting terminal Da. Further, around the opening BKb formed on that area corresponding to the connecting terminal Da is formed a groove BKc surrounding the opening BKb. Function of the groove BKc will be explained later.

Figure 1E:
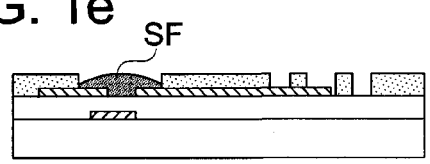

Next, an organic semiconductor layer SF is formed (FIG. 1e). The organic semiconductor layer SF can be formed using an ink jet process wherein ink IK is jetted into the opening BKa of the bank layer BK formed on the channel.

Examples of a material for the organic semiconductor layer SF include polycyclic aromatic compounds or conjugated polymers but are not specifically limited thereto. Materials for the organic semiconductor layer SF may be high molecular weight materials, oligomers or low molecular weight materials, and are preferably those in which the molecules after formation of the film, are regularly aligned due to intermolecular interaction to form a crystal. As the materials for the organic semiconductor layer SF, there can be used pentacene, porphyrin, phthalocyanine, oligothiophene, oligophenylene, polythiophene, polyphenylene and their derivative. Typical examples thereof include pentacene, 6,13-bis(triisopropylsilylethynyOpentacene, tetrabenzoporphyrin, poly(3-hexylthiophene), and the like.

Use of a solvent with a high surface tension in the ink IK improves fluidity control property, however, solubility of organic semiconductor layer materials to the solvent or consistency with the effect due to Marangoni convection or the like during drying process is also an important factor, and therefore, it is important to maintain a balance between factors required during the whole film formation process. As the solvent, the solvents as described above can be used.

Figure 1F:
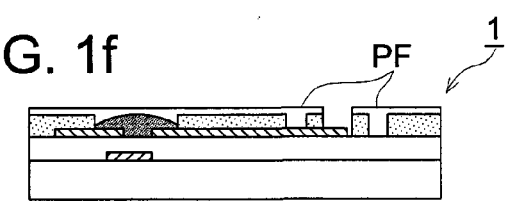
Figure 1G:
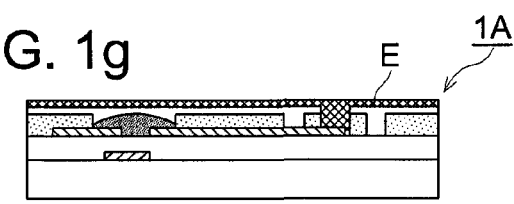

Subsequently, a passivation layer PF is formed which shields or protects the organic semiconductor layer SF from ambient atmosphere (FIG. 1f). This passivation layer PF is formed to cover an area other than the opening BKb in the bank layer BK. As a material for the passivation layer PF, there can be used $SiO_2$, SiN and the like. When the passivation layer PF is formed, a sputtering method can be used, but an atmospheric plasma method is preferably used, since the sputtering method requires a vacuum apparatus resulting in high cost. The atmospheric plasma method can form a thin film with high density and is suitable for formation of the passivation layer PF, which functions as a protective layer for the organic semiconductor layer SE Herein, the passivation layer PF is not necessarily needed, and is optionally formed according to kind of materials used in the organic semiconductor layer SF. Thus, an organic TFT 1 is prepared.

Finally, a pixel electrode E is formed on the organic TFT 1 prepared above (FIG. 1g), thereby preparing an organic TFT array 1A. In this case, the pixel electrode E is connected through the opening BKb formed in the banking layer BK with the connecting terminal Da provided extending from the drain electrode D. The pixel electrode E can be formed by vacuum depositing a pixel electrode material on the organic TFT 1, using a sputtering method, and subjecting the deposited electrode material to photolithography. Alternatively, the pixel electrode E can be formed via direct patterning which is carried out using an IJ process or a printing method. As a material for the pixel electrode, there can be used ITO and the like.

Figure 2A:
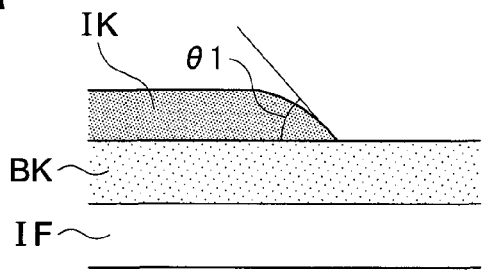
FIGS. 2a and 2b show sectional schematic views explaining function of a bank layer.
Figure 2B:
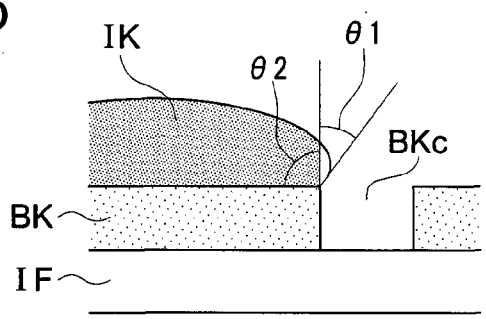

Next, the groove BKc formed in the bank layer BK will be explained with reference to FIG. 2. FIGS. 2a and 2b are schematic sectional views of the circumference of the groove BKc for explaining function of the groove BKc.

The concave-convex surface of the bank layer BK retards a wet-spreading speed of ink IK. Particularly when the surface shape of the bank layer BK varies so that the contact angle of the ink IK increases at the boundary between the concavity and convexity, the ink IK is temporarily pinned at a portion at which the surface shape varies.

There are special bank materials having a surface liquid repellency and a section liquid receptivity, however, a general bank material itself has ordinarily a liquid repellency (resulting from material), and provides the same contact angle on the surface and on the cross-section surface. When the ink IK wet-spreads on the surface of the bank layer BK (FIG. 2a) and arrives at the sidewall (wall of the groove BKc) of the bank layer BK (FIG. 2b), it behaves in a way that it contacts the sidewall at the same contact angle θ1. The surface of the bank layer BK is flexed in the direction distant from the ink IK by the groove BKc, and an apparent contact angle increases by a flexion angle θ2, enhancing liquid repellency. This makes it possible to allow the ink IK to stay at an intended area. When the thickness of the bank layer BK is not less than 50 nm, and preferably not less than 300 nm, then it is possible to increase the angle θ2, which can obtain greater benefit.

Incidentally, in the above embodiment of the invention, the groove BKc is an opening such that the base member is exposed, but may be simply an indentation. The indentation can provide the same effect as described above. Further, a plurality of the grooves BKc surrounding the BKb may be provided, whereby a greater effect can be achieved.

Figure 4:
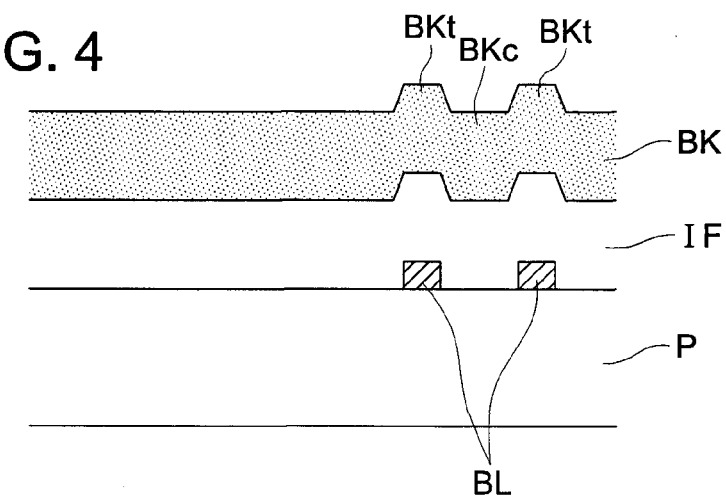
FIG. 4 shows a sectional schematic view demonstrating another embodiment of a groove formation method.

In the above embodiment of the invention, the groove BKc is formed via patterning via photolithography. However, as is shown in FIG. 4, the groove BKc may be formed by providing, under the gate insulation layer IF, a wiring pattern BL, for example, a busline, etc., wherein the thickness of the wiring pattern BL partially raises the surface of the gate insulation layer IF and then partially raises the surface of the bank layer BK formed on the gate insulation layer IF (a raised portion BKt). This reflects the surface shape of the underlying layer such as the gate insulation layer IF and the like into the surface shape of the bank layer BK, since a layer with a thickness of ordinarily not more than 1 μm such as the gate insulation layer IF is difficult to planarize. This method can easily form the groove BKc without employing a photolithographic method, simply by providing a new wiring pattern BL in addition to an existing busline, resulting in simplicity of the manufacturing process and in low cost.

In order to increase the flexion angle θ2 of the bank layer BK or the number of grooves BKc, the photolithographic method and the method using the wiring pattern as described above may be used in combination to form the grooves BKc. This combination use of the two methods can exhibit a synergic effect even when use of one method cannot provide a sufficient effect.

As is described above, in the manufacturing method of the organic TFT 1 in the embodiment of the invention, the bank layer BK comprising the opening BKa on the channel, the opening BKb on the area corresponding to the connecting terminal Da and provided around the opening BKb, the groove BKc surrounding the opening BKb are formed; and the ink IK is supplied to the opening BKa of the bank layer BK formed on the channel to form the organic semiconductor layer SF.

According to this method, even when the ink IK supplied to the opening BKa on the channel flows over the bank during the formation of the organic semiconductor layer SF, the flow of the ink IK into an area (such as the connecting terminal Da), into which the ink is not to flow, is prevented by the groove BKc formed around that area. As a result, an organic TFT 1 with excellent characteristics and high reliability can be manufactured.

Figure 3:
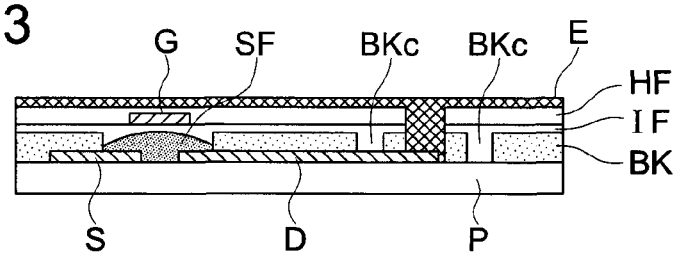
FIG. 3 shows a sectional schematic view demonstrating a constitution of a top gate type organic TFT in the embodiment of the invention.

In the embodiment of the invention, the constitution of the bottom gate type organic TFT 1 has been shown above, but the constitution of the organic TFT is not specifically limited thereto and may be of a top gate type structure. In the latter, the bank layer BK is formed on the basal plate P with the source electrode S and the drain electrode D as shown in FIG. 3.

Next, an example of the manufacturing method of a bottom gate bottom contact type organic TFT 1 in the embodiment of the invention will be explained with reference to FIG. 1 described above.

EXAMPLE

Firstly, a light sensitive photoresist was coated on a soda lime glass plate (FIG. 1*a*: a basal plate P) for an STN liquid crystal with a SiO$_2$/Cr film sputtered on the surface, then exposed through a photo mask with a pattern of a gate electrode G, and developed to form a gate electrode G shaped photoresist layer. The developed material was immersed in an etching liquid such as cerium ammonium nitrate to remove the Cr film in the portions other than the photoresist layer formed, followed by removal of the resist layer to form the gate electrode G (FIG. 1*a*).

Subsequently, a light sensitive organic insulation layer was formed employing a sputtering method to form a gate insulation layer IF with a thickness of 500 nm (FIG. 1*b*).

Subsequently, a lift off resist was coated on the gate insulation layer IF, and subjected to patterning via a photolithographic method, followed by forming a 5 nm thick Cr film and a 50 nm Au film in that order via a sputtering method. After that, the resulting material was subjected to ultrasonic washing in dimethylformamide at room temperature to remove an unnecessary lift off resist, whereby a source electrode S and a drain electrode D were formed (FIG. 1*c*). The channel length or a distance between the source electrode S and the drain electrode D was 10 μm, and the channel width was 100 μm.

Subsequently, a liquid repellent bank material available on the market (NPAR-502, produced by NISSAN CHEMICAL INDUSTRIES LTD.) was coated on the basal plate P with the gate electrode G, the gate insulation Film IF, the source electrode S and the drain electrode D formed, employing a spin coat method, and subjected to patterning via a photolithographic method to form a bank layer BK (FIG. 1*d*).

In the above patterning, an opening BKa with a size of 20 μm×100 μm was provided on the channel at a pitch of 141 μm, and an opening BKb with a size of 10 μm×10 μm was provided on an area extending from the drain electrode D and corresponding to the connecting terminal Da. A groove BKc surrounding the opening BKb was provided at a position 5 μm distant from the opening BKb. The center of the channel and the center of the connecting terminal Da were positioned diagonally so that the centers of the channels and the centers of the connecting terminals Da form a zigzag pattern.

Subsequently, the ink IK, in which 6,13-bistriethylsilyl-ethynylpentacene was dissolved in tetrahydronaphthalene in an amount of 3% by weight, was jetted into the opening BKa of the bank layer BK formed on the channel, employing a piezoelectric ink jet printing process to form an organic semiconductor layer SF (FIG. 3*e*).

Thus, an organic TFT 1 was manufactured. The organic TFT 1 was observed through an optical microscope and AMF (produced by KEYENCE CO., LTD.). As a result, it has proved that the ink IK did not flow into the connecting terminal Da extending from the drain electrode D, and the organic semiconductor layer SF with an average thickness of 50 nm was formed with high accuracy on the channel.

EXPLANATION OF THE SYMBOLS

1: ORGANIC TFT (ORGANIC THIN FILM TRANSISTOR)
1A: ORGANIC TFT ARRAY
BK: BANK LAYER
BL: BUSLINE
D: DRAIN ELECTRODE
E: PIXEL ELECTRODE
G: GATE ELECTRODE
HF: PLANARIZED LAYER
IF: GATE INSULATION LAYER
IK: ORGANIC SEMICONDUCTOR SOLUTION (INK)
PF: PASSIVATION LAYER
S: SOURCE ELECTRODE
SF: ORGANIC SEMICONDUCTOR LAYER
P: BASAL PLATE

The invention claimed is:

1. A method of manufacturing an organic thin film transistor, the method comprising the steps of:
preparing a base member;
forming a source electrode and a drain electrode with a channel therebetween on the base member;
forming a bank layer on the base member, the bank layer having a first opening on the channel and a second opening on a predetermined area on the base member, the first opening being at a different position from the second opening, and the bank layer having a groove or grooves formed in a surface of the bank layer at a position between the first opening and the second opening; and applying an organic semiconductor solution on the channel through the first opening to form an organic semiconductor layer on the channel,
wherein the predetermined area is an area into which the organic semiconductor solution is not to flow, and
wherein the groove or grooves are configured to prevent the semiconductor solution from getting across the groove or grooves from a side of the first opening and flowing into the second opening when the semiconductor solution having been applied on the channel flows on a surface of the bank layer from the channel and spreads towards the second opening.

2. The method of claim 1, wherein the organic semiconductor solution is applied by an ink jet process.

3. The method of claim 1, wherein the bank layer is to formed of a material having liquid repellency against the organic semiconductor solution.

4. The method of claim 1, wherein the groove is formed to surround the second opening.

5. The method of claim 1, wherein a plurality of the grooves are formed.

6. The method of claim 1, wherein the first opening and the second opening are positioned diagonally on the base member.

7. The method of claim 1, wherein the predetermined area is an area where a connecting terminal extending from the source electrode or the drain electrode is provided.

8. The method of claim 7, further comprising the step of:
forming a pixel electrode to be connected with the connecting terminal through the second opening.

9. The method of claim 1, further comprising the step of:
forming a passivation layer on the organic semiconductor layer.

10. The method of claim 1, wherein the organic thin film transistor is a bottom gate type thin film transistor and the base member comprises a basal plate, a gate electrode formed on the basal plate and a gate insulation layer to cover the gate electrode.

11. The method of claim 10, wherein the groove is formed by raising a part of the bank layer, the part being raised by a part of the gate insulation layer underneath the bank layer, the part of the gate insulation layer being raised by a wiring pattern provided underneath the gate insulation layer.

12. The method of claim 1, wherein the organic thin film transistor is a top gate type thin film transistor and the base member comprises a basal plate.

13. An organic thin film transistor comprising:
a basal plate;
a gate electrode formed on the basal plate;
a gate insulation layer formed on the gate electrode;
a source electrode and a drain electrode with a channel therebetween, said source electrode and said drain electrode being formed on the gate insulation layer;
a bank layer having a first opening on the channel and a second opening on a predetermined area on the basal plate, the first opening being at a different position from the second opening and the bank layer having a groove or grooves formed in a surface of the bank layer at a position between the first opening and the second opening; and
a semiconductor layer formed by applying an organic semiconductor solution on the channel through the first opening,
wherein the predetermined area is an area into which the organic semiconductor solution is not to flow, and
wherein the groove or grooves are configured to prevent the semiconductor solution from getting across the groove or grooves from a side of the first opening and flowing into the second opening when the semiconductor solution having been applied on the channel flows on a surface of the bank layer from the channel and spreads towards the second opening.

14. The organic thin film transistor of claim 13, wherein the groove is formed around the second opening.

15. The organic thin film transistor of claim 13, wherein the predetermined area is an area where a connecting terminal extending from the source electrode or the drain electrode is provided.

16. The organic thin film transistor of claim 13, further comprising:
a pixel electrode to be connected with the connecting terminal through the second opening.

17. An organic thin film transistor comprising:
a basal plate;
a source electrode and a drain electrode with a channel therebetween, said source electrode and said drain electrode being formed on the basal plate;
a bank layer having a first opening on the channel and a second opening on a predetermined area, the first opening being at a different position from the second opening, and the bank layer having a groove or grooves formed in a surface of the bank layer at a position between the first opening and the second opening,
a semiconductor layer formed by applying an organic semiconductor solution on the channel through the first opening,
a gate insulation layer formed on the semiconductor layer; and
a gate electrode formed on the gate insulation layer,
wherein the predetermined area is an area into which the organic semiconductor solution is not to flow, and
wherein the groove or grooves are configured to prevent the semiconductor solution from getting across the groove or grooves from a side of the first opening and flowing into the second opening when the semiconductor solution having been applied on the channel flows on a surface of the bank layer from the channel and spreads towards the second opening.

18. The organic thin film transistor of claim 17, wherein the groove is formed around the second opening.

19. The organic thin film transistor of claim 17, wherein the predetermined area is an area where a connecting terminal extending from the source electrode or the drain electrode is provided.

20. The organic thin film transistor of claim 19, further comprising:
a pixel electrode to be connected with the connecting terminal through the second opening.

21. The method of claim 1, wherein the groove extends through the bank layer or is an indentation in a surface of the bank layer.

22. The method of claim 1, wherein a wall of the groove is configured to prevent flow of the organic semiconductor solution into the groove or grooves when the semiconductor solution flowing on the surface of the bank layer from the channel arrives at the wall of the groove.

23. The method of claim 13, wherein the groove extends through the bank layer or is an indentation in a surface of the bank layer.

24. The method of claim 13, wherein a wall of the groove is configured to prevent flow of the organic semiconductor solution into the groove or grooves when the semiconductor solution flowing on the surface of the bank layer from the channel arrives at the wall of the groove.

25. The method of claim 17, wherein the groove extends through the bank layer or is an indentation in a surface of the bank layer.

26. The method of claim 17, wherein a wall of the groove is configured to prevent flow of the organic semiconductor solution into the groove or grooves when the semiconductor solution flowing on the surface of the bank layer from the channel arrives at the wall of the groove.

* * * * *